United States Patent
Mori et al.

(10) Patent No.: US 7,239,495 B2
(45) Date of Patent: Jul. 3, 2007

(54) OUTPUT CIRCUIT WITH TRANSISTOR OVERCURRENT PROTECTION

(75) Inventors: Kazuhisa Mori, Kanagawa (JP); Ikuo Fukami, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 262 days.

(21) Appl. No.: 10/866,826

(22) Filed: Jun. 15, 2004

(65) Prior Publication Data

US 2004/0252434 A1 Dec. 16, 2004

(30) Foreign Application Priority Data

Jun. 16, 2003 (JP) .............. 2003-170999

(51) Int. Cl.
*H02H 3/08* (2006.01)
(52) U.S. Cl. .................................... 361/93.1
(58) Field of Classification Search ............ 361/93.1
See application file for complete search history.

(56) References Cited

U.S. PATENT DOCUMENTS

| | | | |
|---|---|---|---|
| 4,259,706 A * | 3/1981 | Zocholl ................. 361/96 |
| 4,642,724 A | 2/1987 | Ruta | |
| 5,737,169 A * | 4/1998 | Sellers ................... 361/98 |
| 5,886,543 A * | 3/1999 | Moody ................... 327/77 |
| 5,973,367 A * | 10/1999 | Williams ................ 257/365 |
| 6,052,016 A * | 4/2000 | Sugiura et al. .......... 327/393 |
| 6,137,668 A | 10/2000 | Feldtkeller | |
| 6,282,049 B1 * | 8/2001 | Cameron et al. ........ 360/75 |
| 2002/0176215 A1 * | 11/2002 | Hiyama et al. ........ 361/93.1 |

FOREIGN PATENT DOCUMENTS

| | | |
|---|---|---|
| DE | 197 42 930 C1 | 11/1998 |
| EP | 0 012 547 A1 | 6/1980 |
| JP | 62-243418 | 10/1987 |
| JP | 10-107605 A | 4/1998 |

* cited by examiner

*Primary Examiner*—Burton S. Mullins
*Assistant Examiner*—Ann T. Hoang
(74) *Attorney, Agent, or Firm*—Sughrue Mion, PLLC

(57) ABSTRACT

When the overcurrent detection circuit detects that a voltage drop of the output transistor exceeds a threshold value, it turns on the switch by the first operational amplifier. In the shut-down signal generation circuit, the capacitor is charged with a charge current determined based on a current depending on the voltage drop of the output transistor. The shut-down signal generation circuit generates a shut-down signal to turn off the output switch when a voltage of the capacitor exceeds a voltage of the inverting input terminal of the second operational amplifier.

16 Claims, 9 Drawing Sheets

OUTPUT CIRCUIT WITH TRANSISTOR OVERCURRENT PROTECTION

BACKGROUND OF THE INVENTION

1. Field of the Invention

The present invention relates to an output circuit and, more particularly, to an output circuit having an overcurrent protection function.

2. Description of a Related Art

An output circuit has a switching element to control on/off of power supply to a load according to input control signals. A transistor such as a power MOS is used as the switching element. If an overcurrent flows in the switching element, it can break down the switching element due to overheating and so on. Thus, the output circuit normally has an overcurrent protection function to protect the switching element from the breakdown.

Techniques for the overcurrent protection function of the switching element are described in Japanese Unexamined Patent Application Publication No. 62-243418 and Japanese Unexamined Patent Application Publication No. 10-107605, for example. According to the former technique, a resistor as a current detector is placed in the emitter side of an output transistor constituting a switching element so as to detect an overcurrent flowing in the output transistor. A capacitor connects the base of the output transistor with the base of another transistor for turning off the output transistor. The capacitor is charged or discharged upon detection of an overcurrent by the current detector, thereby intermittently turning on and off the output transistor to protect the switching element.

Generally in the techniques for protecting a switching element from an overcurrent, including those described in the above conventional arts, a time period from the detection of the overcurrent to the turn-off of the switching element, which is called a shut-down time, is set according to a charge/discharge time of the capacitor, that is, a capacitance value of the capacitor, or a resistance value that determines a charge/discharge current value of the capacitor. The shut-down time set in this way is constant regardless of the degree of abnormality occurring in a load. The overheating of the switching element depends on the value and time of the current flowing through the switching element. Thus, in the case where significant abnormality occurs in the load and a large current flows through the switching element, it is necessary to set the shut-down time short in order to avoid that the switching element is broken down before it is forcibly turned off. If, however, the shut-down time is set short and a threshold current for overcurrent detection (a minimum value of an abnormal current) is set low, the switching element can be undesirably turned off due to a rush current immediately after turn-on even when no abnormality occurs in the load.

It is possible to avoid this problem by increasing the threshold current for overcurrent detection. However, if the overcurrent detection threshold current is set high in order to avoid the forced turn-off of the switching element, it is impossible to effectively protect the switching element from the breakdown due to overheating when the degree of abnormality occurring in a load is low and a current which is higher than a steady current of the load but not as high as the overcurrent detection threshold current keeps flowing through the load since the overheating of the switching element depends on the value and time of the current flowing through the switching element.

SUMMARY OF THE INVENTION

In view of the foregoing, it is an object of the present invention to provide an output circuit that can change the shut-down time according to the degree of abnormality occurring in the load so as to effectively protect the switching element from breakdown due to abnormal current flow.

To these ends, according to one aspect of the present invention, there is provided an output circuit comprising an output transistor connected in series with a load for supplying a load current; and a protection circuit for protecting the output transistor; the protection circuit comprising a current detection circuit for detecting if the load current exceeds a threshold value, and an off-signal generation circuit for generating an off-signal to turn off the output transistor after a time depending on a voltage drop of the output transistor is elapsed since the current detection circuit detects that the load current exceeds a threshold value.

In this output circuit, a signal to turn off the output transistor is generated by the off-signal generation circuit after an elapsed time depending on a voltage drop of the output transistor from a time when the current detection circuit detects that a load current flowing through the output circuit exceeds a threshold value, that is, when it detects that abnormality occurs in the load. It is thereby possible to change a time period during which an abnormal current flows through the output transistor according to the degree (level) of the abnormality occurring in the load. For example, if the degree of the abnormality occurring in the load is high, the output switch may be immediately turned off. If the degree of the abnormality is low, on the other hand, the output switch may be turned off after a relatively long period of time. This allows effective protection of the output switch from breakdown due to heat both when the degree of abnormality in a load is high and low.

In this output circuit, the off-signal generation circuit may remove the off-signal after a certain elapsed time from generation of the off-signal. Alternatively, the off-signal generation circuit may remove the off-signal after another elapsed time depending on a voltage drop of the output transistor from generation of the off-signal. If the output circuit has the configuration in which the off-signal generation circuit removes the off-signal after the protection circuit turns off the output transistor, the output circuit may return to the normal operation when the abnormality in the load has been eliminated before the off-signal is removed.

In this output circuit, the current detection circuit may detect if the load current exceeds a threshold value based on whether a voltage drop of the output transistor exceeds a threshold value. In this case, the current detection circuit theoretically detects the level of the load current based on the level of the voltage drop of the output transistor.

In this output circuit, the off-signal generation circuit may comprise a current generator for generating a current depending on a voltage drop of the output transistor and a capacitor to be charged with the current generated by the current generator, and the off-signal generation circuit may generate the off-signal if a terminal voltage of the capacitor exceeds a given value. In this case, an elapsed time before generating the off-signal may be determined based on a charge time of the capacitor.

In this output circuit, the current generator may comprise a current mirror comprising a reference transistor through which a current depending on a voltage drop of the output transistor flows and an output transistor connected in series with the capacitor. In this case, the capacitor is charged by the output transistor. The reference transistor and the output transistor of the current mirror may be connected to a different power system.

In another aspect, in the output circuit, the off signal generation circuit may comprise a clock signal generation circuit for generating a clock signal having a cycle depending on a voltage drop of the output transistor and a counter for counting the clock signal and generating the off-signal after counting a given number of clocks. In this case, an elapsed time period before generating the off-signal may be determined based on a time required for counting up to a given number of clock pulses of the clock signal having the cycle depending on the voltage drop of the output transistor in the off signal generation circuit.

In this output circuit, the clock signal generation circuit may comprise a current generator for generating a current depending on a voltage drop of the output transistor and a capacitor to be charged with the current generated by the current generator, so that the clock signal has a cycle depending on a charge time of the capacitor. Changing the cycle of the clock signal depending on the degree of abnormality occurring in the load allows an elapsed time period before generating the off-signal to be dependent on the degree of the abnormality occurring in the load.

In this output circuit, the current generator may comprise a current mirror comprising a reference transistor through which a current depending on a voltage drop of the output transistor flows and an output transistor connected in series with the capacitor. In this case, the capacitor is charged with a charge/discharge current depending on a current flowing through the output transistor. The reference transistor and the output transistor of the current mirror may be connected to a different power system.

In this output circuit, load elements comprising a MOS transistor of which a gate and a source are connected to each other and at least one zener diode connected in series with the MOS transistor may be connected in series with the reference transistor of the current mirror.

The output circuit determines a time period from when a voltage drop of the output transistor exceeds a threshold value to when the off-signal generation circuit generates an off-signal based on a voltage-current characteristics of the reference transistor of the current mirror. By connecting the zener diode in serial with the MOS transistor of which the gate and the source are connected to each other or with a resistor, it is possible to change the voltage-current characteristics of the reference transistor of the current mirror. The number of zener diodes to be connected may be appropriately adjusted to obtain desired current-voltage characteristics of the reference transistor.

In the output circuit, a plurality of the load elements connected in parallel may be connected to the reference transistor. In this case, by connecting a plurality of load elements with different current-voltage characteristics in parallel, it is possible to obtain desired current-voltage characteristics of the reference transistor.

In the output circuit, another MOS transistor of which a gate and a source are connected to each other may be connected in parallel with the load elements.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
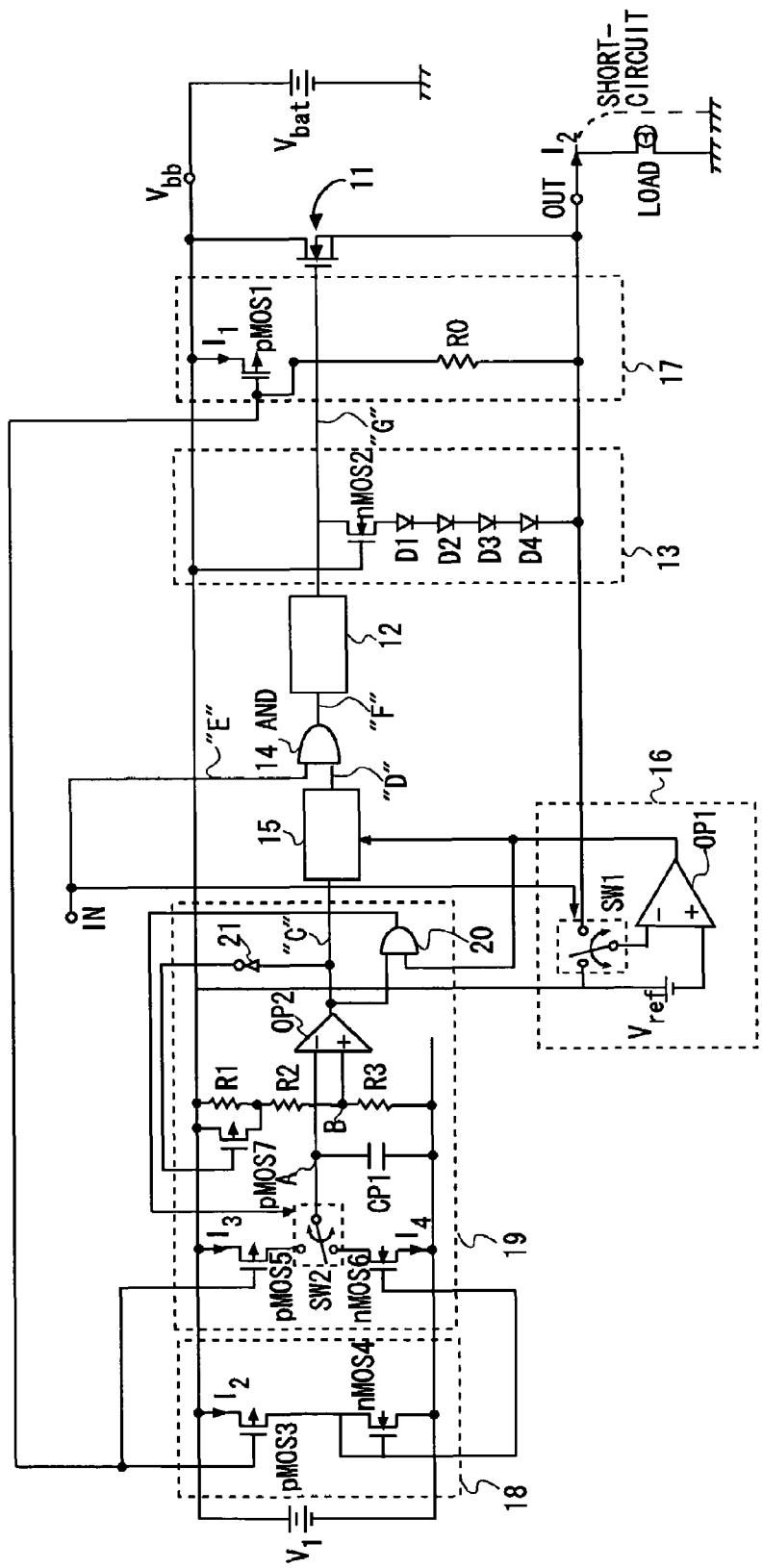
FIG. 1 is a block diagram showing the configuration of an output circuit according to the first embodiment of the present invention.

Specific embodiments of the present invention are explained hereinafter in detail with reference to the drawings. Referring first to FIG. 1, the configuration of an output circuit according to the first embodiment of the present invention is shown. The output circuit 10 has an output switch 11, a gate control circuit 12, a current limitation circuit 13, an AND circuit 14, a counter 15, an overcurrent detection circuit 16, current generation circuits 17 and 18, and a clock generator 19. The output circuit 10 of this embodiment can change a clock pulse width (clock signal cycle) of a clock signal "C" generated by the clock generator 19 depending on a voltage difference $V_{on}$ between a power terminal Vbb and an output terminal OUT.

The output switch 11 is composed of a semiconductor switching element such as a power MOS, for example, and placed between the power terminal Vbb to which a power source such as a battery is connected and the output terminal OUT to which a load such as a lamp or a solenoid coil is connected. The gate control circuit 12 controls the switching of the output switch 11. The current limitation circuit 13 prevents a large current such as a short-circuit current from flowing into the output switch 11. The AND circuit 14 inputs an AND signal "F" of a control signal "E" from an input terminal IN and an output signal "D" from the counter 15 into the gate control circuit 12.

The counter 15, the overcurrent detection circuit 16, the current generation circuits 17 and 18, and the clock generator 19 constitute a protection circuit. The overcurrent detection circuit 16 detects if an abnormal current that exceeds a threshold level flows through the output switch 11. The first current generation circuit 17 generates a current $I_1$ that depends on a voltage difference between the power terminal Vbb and the output terminal OUT. The second current generation circuit 18 generates a current $I_2$ that is based on the current $I_1$. The clock generator 19 generates a clock signal "C" that is based on the second current $I_2$. The counter 15 counts the clock pulse of the clock signal "C" and outputs a signal "D" of high-level or low-level.

Figure 2:
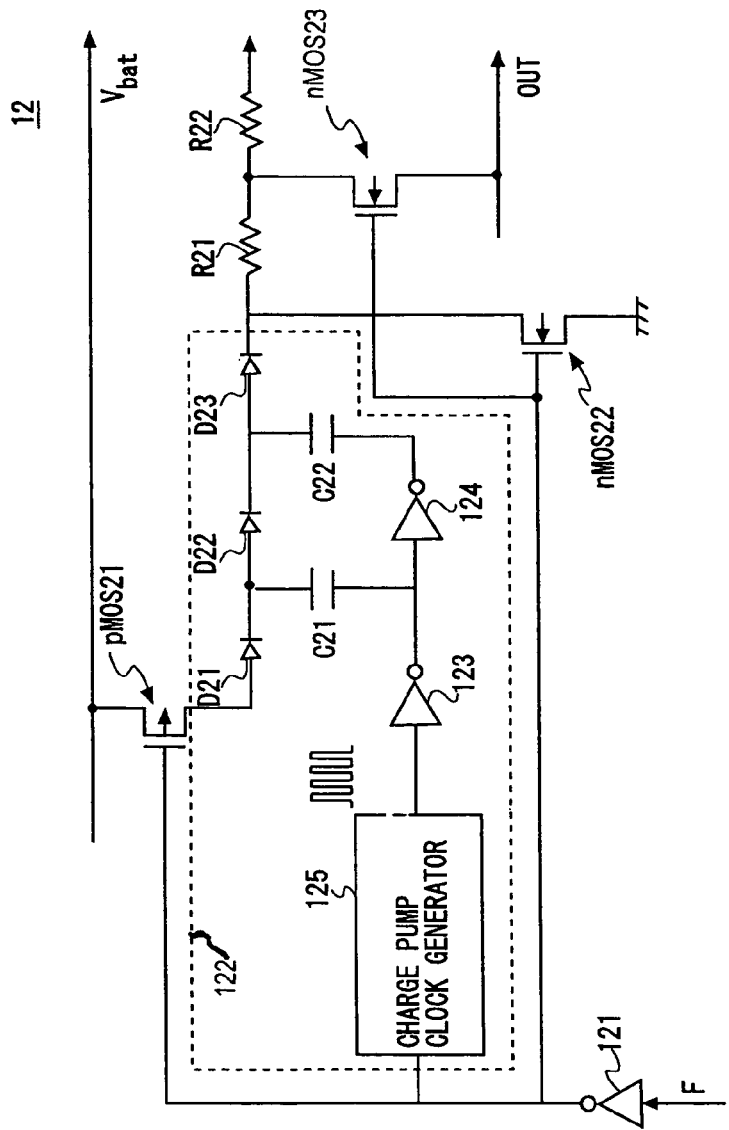
FIG. 2 is a block diagram showing the exemplary configuration of a gate control circuit.

Referring next to FIG. 2, an example of the configuration of the gate control circuit 12 is shown. The gate control circuit 12 has an inverter 121, a charge pump circuit 122, a pMOS 21, nMOS 22 and 23, and resistors R21 and R22. The charge pump circuit 122 has inverters 123 and 124, diodes D21 to D23, capacitors C21 and C22, a charge pump clock generator 125. The gate control circuit 12 outputs a gate control signal "G" that is based on the input AND signal "F" to control the switching of the output switch 11.

If a high level of AND signal "F" is input to the gate control circuit 12 through the inverter 121, the charge pump clock generator 125 is activated, and the charge pump circuit 122 generates such voltage that the power voltage Vbat is increased to Vbat+10V, for example. In this case, the pMOS 21 is on and the nMOS 22 and nMOS 23 are off, and the gate control circuit 12 outputs the gate control signal "G" in which the voltage increased by the charge pump circuit 122 is a high level to turn on the output switch 11. If, on the other hand, a low level of AND signal "F" is input to the gate control circuit 12 through the inverter 121, the nMOS 22 and nMOS 23 are on and the PMOS 21 is off. In this case, a signal line connecting the gate control circuit 12 and the output switch 11 is shorted out with the output terminal OUT to turn off the output switch 11.

Referring back to FIG. 1, the AND circuit 14 inputs the AND signal "F" of the control signal "E" from the input terminal IN and the output signal "D" from the counter 15 into the gate control circuit 12. The counter 15 outputs a high level of signal "D" in normal times when the overcurrent detection circuit 16 does not detect an abnormal current flow in the output switch 11. On the contrary, it outputs a low level of signal "D" under a given condition, which is described later, when the overcurrent detection circuit 16 detects the abnormal current flow. When the counter 15 outputs the high level of signal "D", the AND circuit 14 outputs the AND signal "F" based on the control signal "E".

The current limitation circuit 13 has the nMOS 2 and the diodes D1 to D4. The nMOS 2 and the diodes D1 to D4 are inserted serially between the signal line connecting the gate control circuit 12 and the output switch 11, and the output terminal OUT. The gate of the nMOS 2 is connected to the power terminal Vbb. The current limitation circuit 13 operates in the following way to reduce the level (voltage) of the gate control signal "G" upon occurrence of abnormality in the load so as to limit the current flowing through the output switch 11 to a given level, thereby preventing a large current such as a short-circuit current of more than 600A, for example, from flowing into the output switch 11.

When the output switch 11 is on, if no abnormality occurs in the load, the voltage (output voltage) Vout between the output terminal OUT and the ground is substantially equal to the power voltage Vbat. In this case, the nMOS 2 is off and no current flows through the diodes D1 to D4. If, on the other hand, abnormality occurs in the load and the output terminal OUT is grounded equivalently as shown by a dotted line in FIG. 1, the output voltage Vout is substantially equal to a ground voltage. In this case, the nMOS 2 is on to allow a current to flow from the signal line connecting the gate control circuit 12 and the output switch 11 to the output terminal OUT through the diodes D1 to D4. The level of the gate control signal "G" thereby decreases to suppress the current flowing through the output switch 11. The current limitation circuit 13 limits the current value to about double the maximum value of a rush current immediately after turning on the output switch 11; thus, the current value is limited to 200A if the maximum rush current value is 100A, for example.

The first current generation circuit 17 has a pMOS 1 and a resistor R0. The pMOS 1 and the resistor R0 are inserted serially between the power terminal Vbat and the output terminal OUT, and the gate of the pMOS 1 is connected to the drain of the same. The first current generation circuit 17 generates a current $I_1$ that changes depending on a voltage difference $V_{on}$ (=Vbat−Vout) between the power terminal Vbb and the output terminal OUT.

The second current generation circuit 18 has a pMOS 3 and a nMOS 4. The pMOS 3 and the nMOS 4 are inserted between both lines of a power source V1. In the second current generation circuit 18, the gate of the nMOS 4 is connected to the drain of the pMOS 3, and the gate of the pMOS 3 is connected to the gate of the pMOS 1 in the first current generation circuit 17. Thus, the pMOS 3 of the second current generation circuit 18 and the pMOS 1 of the first current generation circuit 17 constitute a current mirror, and the second current generation circuit 18 generates a current $I_2$ that depends on the current $I_1$ generated by the first current generation circuit 17.

The second current generation circuit 18 determines a charge current $I_3$ and a discharge current $I_4$ for determining the cycle of the clock signal "C" generated by the clock generator 19. Since the current $I_2$ generated by the second current generation circuit 18 is proportional to the current $I_1$ generated by the first current generation circuit 17, the cycle of the clock signal "C" generated by the clock generator 19 depends on the voltage difference between the power terminal Vbb and the output terminal OUT.

The overcurrent detection circuit 16 has an operational amplifier OP1 and a switch SW1 to detect if an abnormal current flows through the output switch 11. In the operational amplifier OP1, an inverting input terminal is connected to the switch SW1 and a non-inverting input terminal is connected to the power terminal Vbb through a power source $V_{ref}$ for determining a threshold voltage. According to the control signal "E" input through the input terminal IN, the switch SW1 connects the inverting input terminal of the operational amplifier OP1 with the power terminal Vbb or with the output terminal OUT. The overcurrent detection circuit 16 outputs a high level of overcurrent detection signal if the voltage input to the inverting input terminal of the OP1 falls below the voltage (Vbat−$V_{ref}$) input to the non-inverting input terminal of the OP1.

When the control signal "E" is low level to turn off the output switch 11, the switch SW1 connects the inverting input terminal of the operational amplifier OP1 with the power terminal Vbb. The voltage input to the inverting input terminal is thereby higher than the voltage input to the non-inverting input terminal, and the overcurrent detection circuit 16 outputs a low level of overcurrent detection signal. When, on the other hand, the control signal "E" is high level to turn on the output switch 11, the switch SW1 connects the inverting input terminal of the operational amplifier OP1 with the output terminal OUT. If the voltage of the output terminal OUT input to the inverting input terminal is lower than the voltage input to the non-inverting input terminal, that is, if the voltage of the output terminal OUT is lower than (Vbat−$V_{ref}$), the overcurrent detection circuit 16 outputs a high level of overcurrent detection signal.

In this way, the overcurrent detection circuit 16 detects an abnormal current flow in the output switch 11 and outputs the high level of overcurrent detection signal in the case where the voltage difference $V_{on}$ between the power terminal Vbb and the output terminal OUT exceeds the threshold value $V_{ref}$ when the output switch 11 is to be turned on. For example, to detect the state where a 20A or more current flows as an abnormal current through the output switch 11 having 10 mΩ of on-resistance, the threshold value $V_{ref}$ is set to 0.2V.

The counter 15 counts clock pulses of the clock signal "C" generated by the clock generator 19 in response to the high level of overcurrent detection signal. When the clock pulse counts reach a given value, the counter 15 outputs a low level of signal "D", which is called Off-signal. The counter 15 further counts the clock pulses of the clock signal "C" up to another given number and then removes the Off-signal to set the signal "D" back to a high level. For example, the counter 15 may count up to 50 counts of the clock pulses of the clock signal "C" before it outputs the low level of signal "D", and further count up to 100 counts before it outputs the high level of signal "D".

The clock generator 19 has a pMOS 5 for charging, a nMOS 6 for discharging, a pMOS 7 for bypass, an operational amplifier OP2, a capacitor CP1, resistors R1 to R3, a switch SW2, an AND circuit 20, and an inverter 21. The clock generator 19 generates a clock signal "C" of high or low level based on a voltage difference between the inverting input terminal and the non-inverting input terminal of the operational amplifier OP2 and inputs the clock signal "C" to the counter 15.

The resistors R1 to R3 are inserted in serial between both power lines of the power source V1. The bypass pMOS 7 is connected in parallel with the resistor R1. The clock signal "C" is input to the gate of the bypass pMOS 7 through the inverter 21. The bypass pMOS 7 is on when the clock signal "C" is high level and it is off when the clock signal "C" is low level. A node B connecting the resistors R2 and R3 is connected to a non-inverting input terminal of the operational amplifier OP2. One terminal of the capacitor CP1 is connected to an inverting terminal (node A) of the operational amplifier OP2, and the other terminal is connected to the lower-voltage power line of the power source V1.

The AND circuit 20 outputs the AND of an overcurrent detection signal output from the overcurrent detection circuit 16 and the clock signal "C". The switch SW2 is controlled according to the output from the AND circuit 20 to adjust the charge/discharge of the capacitor CP1. When the AND circuit 20 outputs a high-level signal, the switch SW2 connects the node A with the drain of the charge pMOS 5 to charge the capacitor CP1. When the AND circuit 20 outputs a low-level signal, on the other hand, the switch SW2 connects the node A with the drain of the discharge nMOS 6 to discharge the capacitor CP1. When the overcurrent detection circuit 16 outputs a low level of overcurrent detection signal, the SW2 connects the node A with the drain of the discharge nMOS 6 and the voltage of the node A is lower than the voltage of the node B; thus, the clock signal "C" output from the operational amplifier OP1 is kept high.

The charge PMOS 5 is inserted between the higher-voltage power line of the power source V1 and the switch SW2. The gate of the charge pMOS 5 is connected to the gate of the pMOS 3 of the second current generation circuit 18, and the charge pMOS 5 and the pMOS 3 of the second current generation circuit 18 constitute a current mirror. When the switch SW2 connects the node A to the drain of the charge pMOS 5, the capacitor CP1 is charged with a current $I_3$ based on the current $I_2$ generated by the second current generation circuit 18 through the charge PMOS 5.

The discharge nMOS 6 is inserted between the lower-voltage power line of the power source V1 and the switch SW2. The gate of the discharge nMOS 6 is connected to the gate of the nMOS 4 of the second current generation circuit 18, and the discharge nMOS 6 and the nMOS 4 of the second current generation circuit 18 constitute a current mirror. When the switch SW2 connects the node A to the drain of the discharge nMOS 6, the capacitor CP1 is charged with a current $I_4$ based on the current $I_2$ generated by the second current generation circuit 18 through the discharge nMOS 6.

Figure 3:
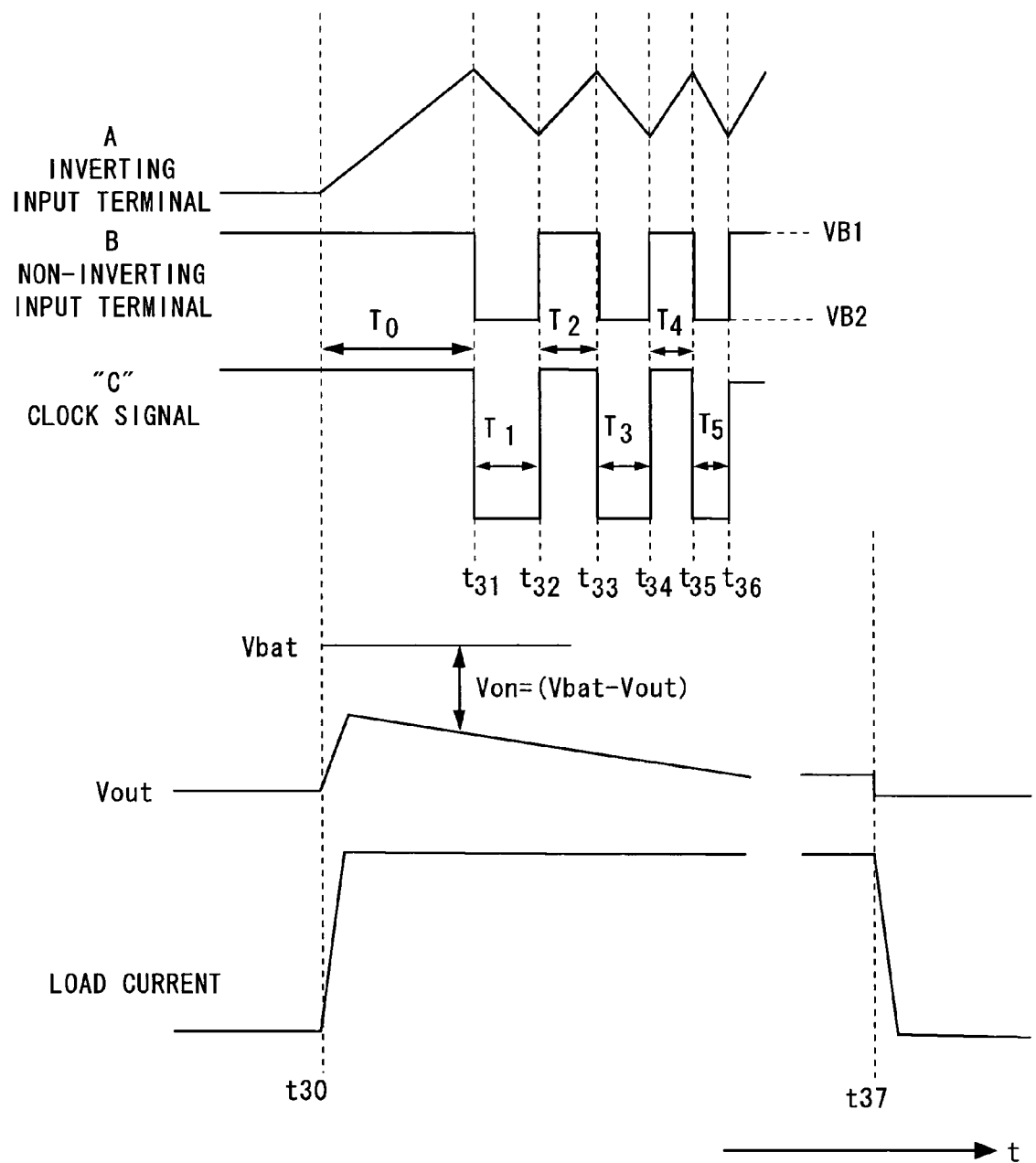
FIG. 3 is a timing chart showing the generation of a clock signal "C".

Referring now to FIG. 3, generation of the clock signal "C" in the clock generator 19 is illustrated as a waveform. FIG. 3 shows the case where the short-circuit of the load progress, and the output voltage Vout decreases with time after the output switch 11 is turned on at time $t_{30}$. If the overcurrent detection circuit 16 detects that the voltage difference $V_{on}$ between the power terminal Vbb and the output terminal OUT exceeds the threshold value $V_{ref}$, the switch SW2 of the clock generator 19 connects the node A with the drain of the charge pMOS 5 according to the AND of the high level of clock signal "C" and a high level of overcurrent detection signal, thereby starting charge/discharge of the capacitor CP1.

At $t_{30}$ to $t_{31}$, the clock signal "C" is at a high level and the bypass pMOS 7 is on. If the voltage of the non-inverting input terminal (node B) of the operational amplifier OP2 is VB1, VB1=V1×(R3/(R2+R3)). The switch SW2 selects the charge pMOS 5 according to the signal from the AND circuit 20 outputting a high level to start charging the capacitor CP1 of the clock generator 19 with a charge current $I_3$ based on the current $I_2$ generated by the second current generation circuit 18 which constitutes a current mirror together with the first current generation circuit 17.

Charging the capacitor CP1 increases the voltage of the inverting input terminal (node A) of the operational amplifier OP2. At $t_{31}$ when the voltage of the inverting input terminal (node A) of the OP2 exceeds the voltage VB1 of the non-inverting input terminal, the output of the operational amplifier OP2 is inverted to invert the clock signal "C" to a low level. When the clock signal "C" becomes the low level, the bypass pMOS 7 is turned off. The voltage VB2 of the non-inverting input terminal of the operational amplifier OP2 at this time is: VB2=V1×(R3/(R1+R2+R3)) (<VB1). The AND circuit 20 outputs a low-level signal based on the clock signal "C" which has become the low-level, and the switch SW2 switches to select the discharge nMOS 6. In the clock generator 19, discharge of the capacitor CP1 starts with a discharge current $I_4$ based on the current $I_2$ generated by the second current generation circuit 18 which constitutes a current mirror together with the first current generation circuit 17.

Discharging the capacitor CP1 decreases the voltage of the inverting input terminal of the operational amplifier OP2. At $t_{32}$ when the voltage of the inverting input terminal of the OP2 falls below the voltage VB2 of the non-inverting input terminal, the output of the operational amplifier OP2 is again inverted to invert the clock signal "C" a high level. When the clock signal "C" becomes the high level, the bypass pMOS 7 is again turned on. The voltage of the non-inverting input terminal of the operational amplifier OP2 thereby becomes VB1. The switch SW2 again switches to select the charge pMOS 5, thereby starting the charge of the capacitor CP1 in the clock generator 19. In the clock generator 19, the charge/discharge of the capacitor CP1 is repeated in this way, generating the clock signal "C".

Since the charge current $I_3$ and the discharge current $I_4$ of the capacitor CP1 are determined based on the current $I_2$ generated by the second current generation circuit 18, which is based on the current $I_1$ generated by the first current generation circuit 17 and varying depending on the voltage difference $V_{on}$ between the power terminal Vbb and the output terminal OUT, these current values depend on the voltage difference $V_{on}$ between the power terminal Vbb and the output terminal OUT. Further, since a high-level period and a low-level period of each clock pulse of the clock signal "C" is determined by the charge/discharge current of the capacitor CP1, the cycle of the clock signal "C" depends on the voltage difference $V_{on}$ between the power terminal Vbb and the output terminal OUT.

In the case shown in FIG. 3, the short-circuit progresses with time to increase the voltage difference $V_{on}$ between the power terminal Vbb and the output terminal OUT, the charge current $I_3$ and the discharge current $I_4$ increase with time. Thus, the comparison of the three low-level periods $T_1$ from $t_{31}$ to $t_{32}$, $T_3$ from $t_{33}$ to $t_{34}$, and $T_5$ from $t_{35}$ to $t_{36}$ results in $T_1 > T_3 > T_5$. Further, the comparison of the high-level periods $T_2$ from $t_{32}$ to $t_{33}$ and $T_4$ from $t_{34}$ to $t_{35}$ results in $T_2 > T_4$. The cycle of the clock signal "C" decreases with time.

Figure 4:
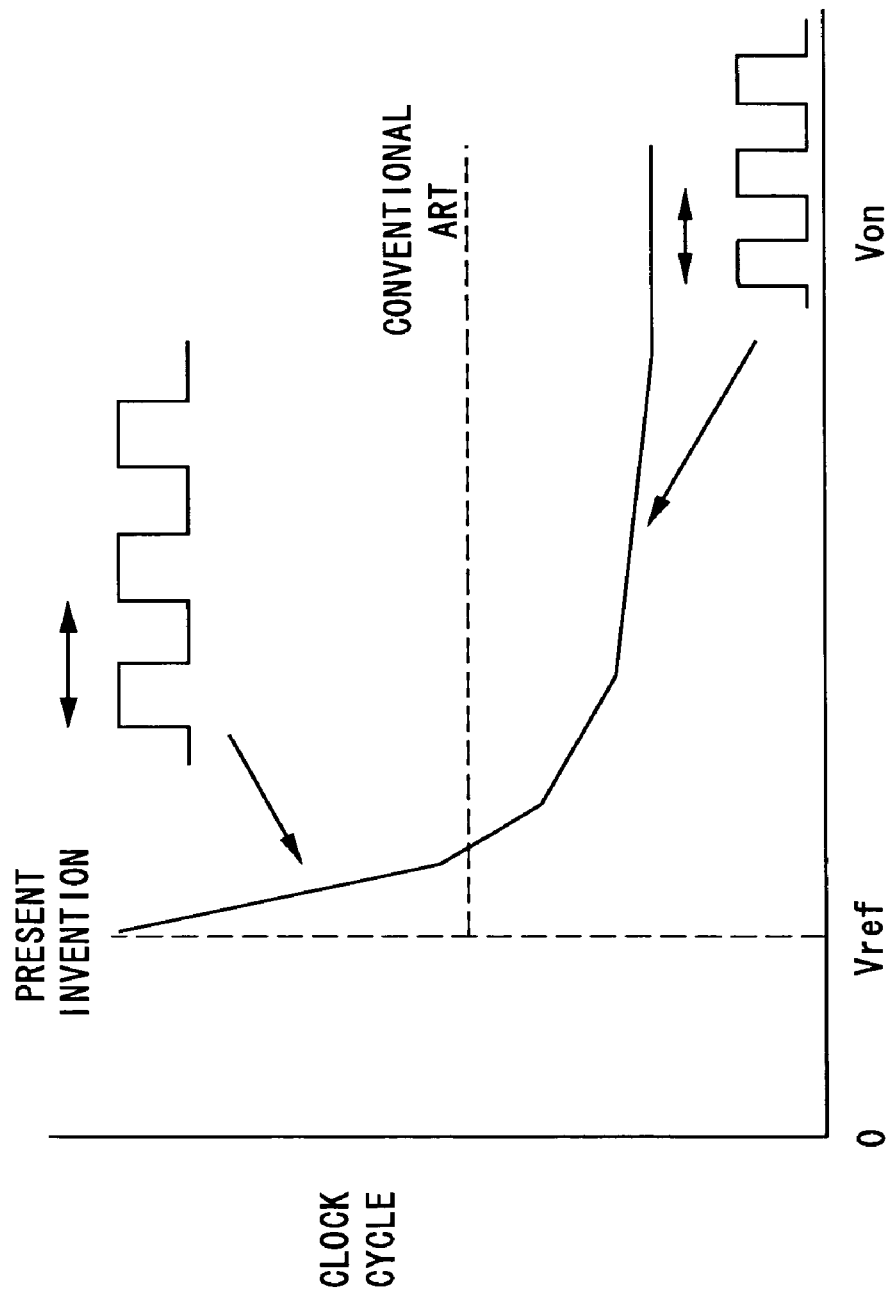
FIG. 4 is a graph showing a relationship of a voltage difference $V_{on}$ and the cycle of a clock signal "C".

Referring then to FIG. 4, the relationship of the voltage difference $V_{on}$ between the power terminal Vbb and the output terminal OUT, and the cycle of the clock signal "C" is shown in the graph. If the first current generation circuit 17 is composed of the series circuit of the pMOS 1 and the resistor R0 as shown in FIG. 1, the cycle of the clock signal "C" changes as shown in FIG. 4, according to the voltage difference $V_{on}$ between the power terminal Vbb and the output terminal OUT. In this case, the cycle of the clock signal "C" makes a sharp drop in the range where the voltage difference $V_{on}$ between Vbb and OUT slightly exceeds the threshold voltage $V_{ref}$ in the overcurrent detection circuit 16; on the other hand, it makes a gradual drop in the range where the voltage difference $V_{on}$ between Vbb and OUT is sufficiently high.

Since the cycle of the clock signal "C" changes according to the voltage difference $V_{on}$ between the power terminal Vbb and the output terminal OUT as described above, a time required for the counter 15 to count up to a given number of clock pulses of the clock signal "C" is determined by the voltage difference $V_{on}$ between Vbb and OUT. When the counter 15 counts the clock pulses of the clock signal "C" up to a given number at $t_{37}$ in FIG. 3, the counter 15 outputs a low-level signal "D". Thus, the output switch 11 is forcibly turned off and thereby protected from breakdown.

In the event of short-circuit in the load, whether an apparent load resistance becomes 50% or 0% is normally determined by the voltage difference $V_{on}$ between the power terminal Vbb and the output terminal OUT. In other words, the degree of abnormality occurring in the load can be determined based on the voltage difference $V_{on}$ between Vbb and OUT. Since the configuration of this embodiment allows changing the cycle of the clock signal "C" according to the voltage difference $V_{on}$ between Vbb and OUT, it is possible to change a shut-down time, which is a time period from the occurrence of abnormality in the load to the forced turn-off of the output switch 11, according to the degree of the abnormality occurring in the load.

If the shut-down time is constant regardless of the voltage difference between the power terminal Vbb and the output terminal OUT as is the case with conventional output circuits, it is impossible to effectively protect the output switch from breakdown both when the degree of abnormality in a load is high and low. In the output circuit 10 according to this embodiment, if the degree of the abnormality occurring in the load is high and the voltage difference $V_{on}$ between Vbb and OUT is large, the output switch 11 can be immediately turned off. If the degree of the abnormality is low, on the other hand, the output switch 11 can be turned off after a certain period of time. It is thereby possible to effectively protect the output switch 11 from breakdown according to the degree of abnormality.

In the output circuit 10, the counter 15 counts a certain number of clock pulses of the clock signal "C" to forcibly turn off the output switch 11. Even after the output switch 11 is forcibly turned off, if the control signal "E" input through the input terminal IN is high level, the voltage difference $V_{on}$ between the power terminal Vbb and the output terminal OUT is Vbat, and the overcurrent detection circuit 16 keeps outputting a high level of overcurrent detection signal, and the clock generator 19 keeps generating the clock signal "C". The cycle of the clock signal "C" at this time is determined based on the current $I_1$ generated by the first current generation circuit 17 and depending on the voltage difference between the power voltage Vbat and the ground voltage. The cycle is thus constant.

The counter 15 starts counting the clock pulses of the clock signal "C". When the counter 15 counts up to a given number, that is, after the output switch 11 is forcibly turned off, the counter 15 further counts up to another given number of clock pulses of the clock signal "C" and then sets the output signal "D" back to a high level. When the output signal "D" from the counter 15 becomes high level again, the output switch 11 is again turned on based on the control signal "E" input through the input terminal IN. If the abnormality of the load has been eliminated when the output switch 11 is again turned on, the output switch 11 keeps the on-state and supplies a power Vbat to the load. If, on the other hand, the abnormality of the load is not eliminated after turning on the output switch 11 again, the counter 15 again counts the clock pulses of the clock signal "C" up to a given number as described above, again forcibly turning off the output switch 11.

Figure 5:
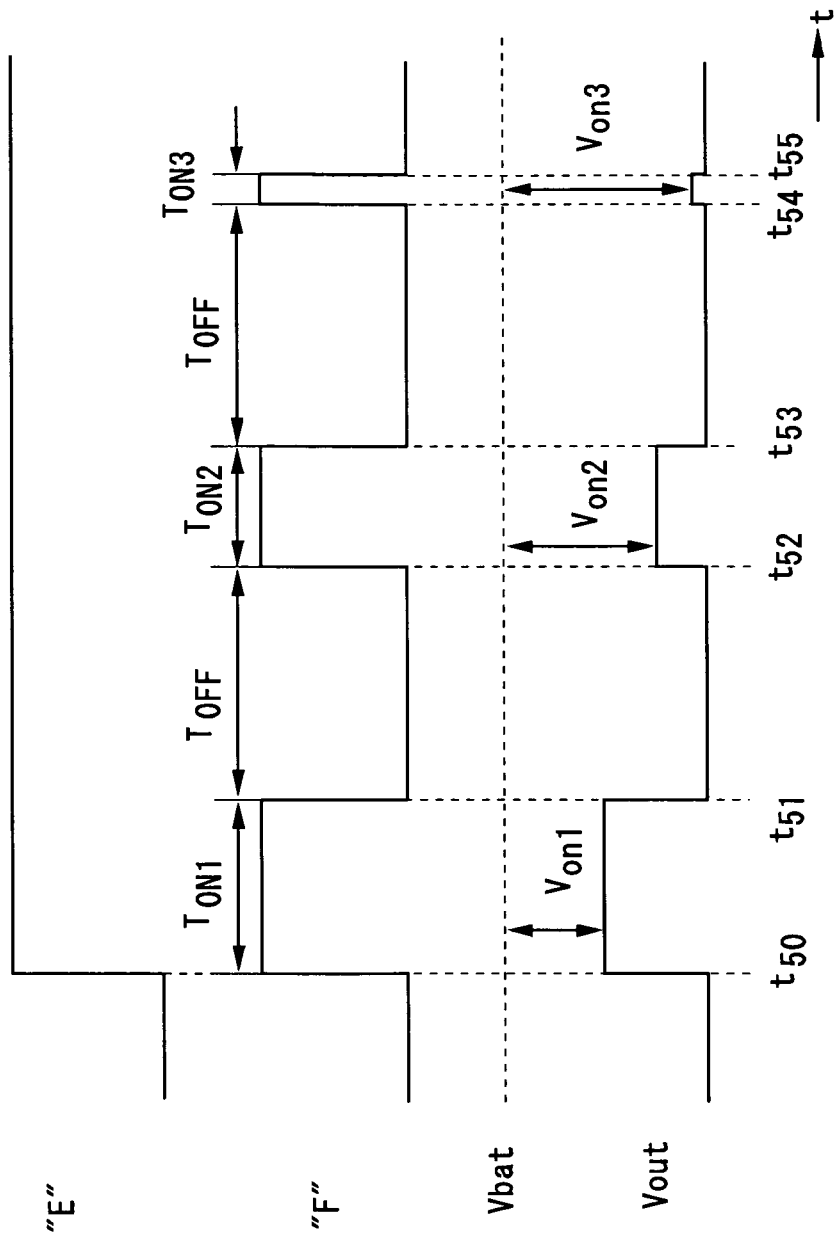
FIG. 5 is a timing chart showing a change in a shut-down time.

Referring now to FIG. 5, a change in the shut-down time is illustrated in a timing chart. At $t_{50}$ when the control signal "E" rises to a high level, a high level of AND signal "F" is input to the gate control circuit 12 to turn on the output switch 11. If at this time the abnormality is occurring in the load and the value of the output voltage Vout is about half the value of the voltage Vbat supplied to the power terminal Vbb, the counter 15 in the output circuit 10 counts the clock pulses of the clock signal "C" of which cycle is determined by the voltage difference $V_{on1}$ between the power terminal Vbb and the output terminal OUT. At $t_{51}$ when the counted number reaches a given value, the counter 15 inputs a low-level signal "D" to the AND circuit 14, and the AND signal "F" input to the gate control circuit 12 falls to a low level to forcibly turn off the output switch 11.

After outputting the low-level signal "D" at $t_{51}$, the counter 15 makes the signal "D" rise to a high level at $t_{52}$ after a certain time period ($T_{OFF}$) required to count one cycle of the clock signal "C" up to another given number. Thus, the AND signal "F" input to the gate control circuit 12 rises to a high level to again turn on the output switch 11. If the abnormality of the load has not been eliminated after the output switch 11 again becomes on, the output switch 11 is again forcibly turned off at $t_{53}$ in FIG. 5. At $t_{52}$ to $t_{53}$, if the abnormality occurring in the load progresses compared to that at $t_{50}$ to $t_{51}$ and the output voltage Vout is about one-fourth of the voltage Vbat supplied to the power terminal Vbb, the voltage difference $V_{on2}$ between the power terminal Vbb and the output terminal OUT is larger than $V_{on1}$, and the cycle of the clock signal "C" becomes shorter than that at $t_{50}$ to $t_{51}$, reducing the shut-down time.

When the counter 15 outputs a high-level signal "D" at $t_{54}$, the output switch 11 is turned on. If the abnormality of the load further progresses at this time, the voltage difference $V_{on3}$ between the power terminal Vbb and the output terminal OUT is larger than $V_{on2}$, and the output switch 11 is forcibly turned off at $t_{55}$. The comparison of three time periods $T_{ON1}$ from $t_{50}$ to $t_{51}$, $T_{ON2}$ from $t_{52}$ to $t_{53}$, and $T_{ON3}$ from $t_{54}$ to $t_{55}$, each from when the output switch 11 is turned on to when it is forcibly turned off, results in:

$$T_{ON1} > T_{ON2} > T_{ON3}$$

which is inversely proportional to the degree of the abnormality occurring in the load. In this way, this embodiment can shorten the shut-down time as the abnormality occurring in the load progresses, thereby effectively protecting the output switch 11 from breakdown.

Figure 6:
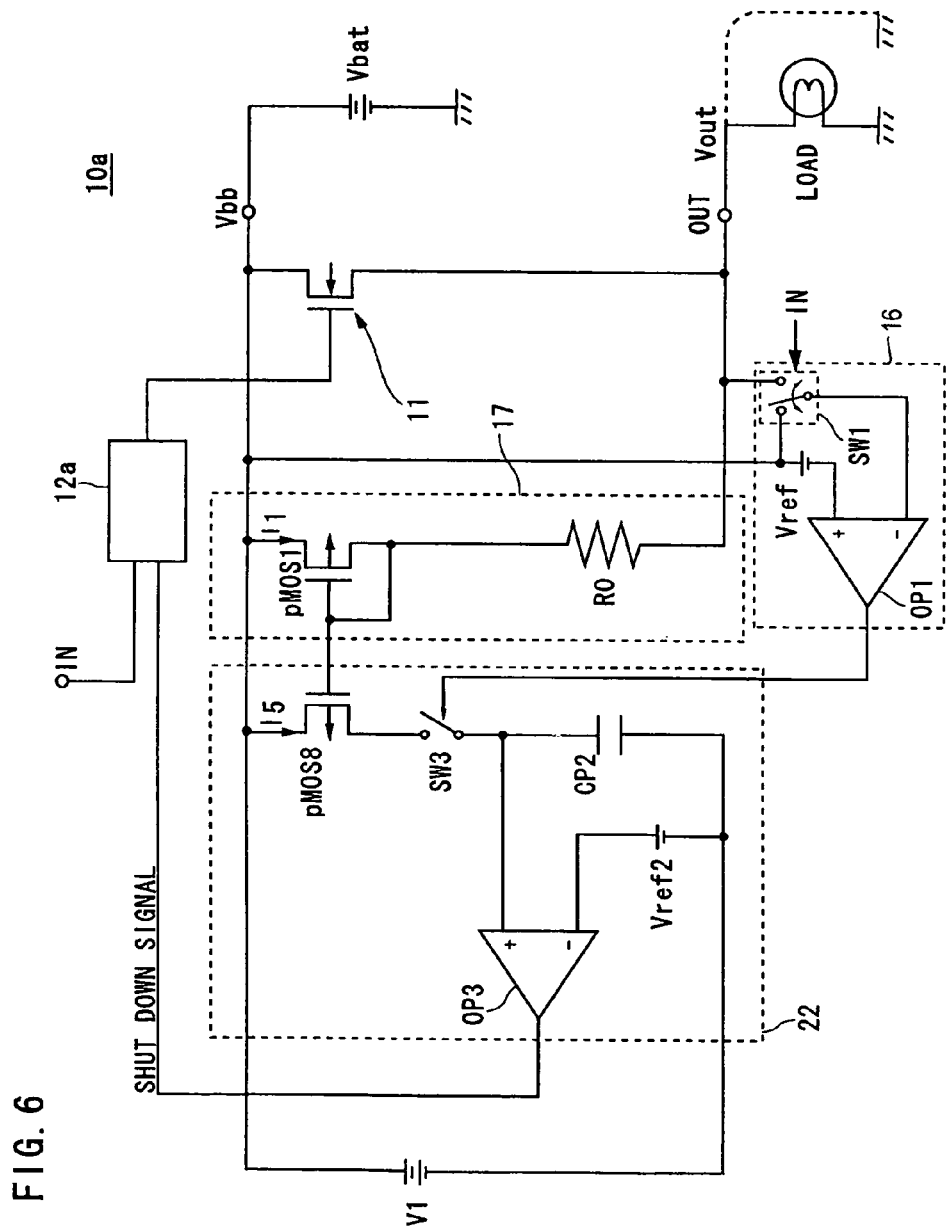
FIG. 6 is a block diagram showing the configuration of an output circuit according to the second embodiment of the present invention.

Referring now to FIG. 6, the configuration of the output circuit according to the second embodiment of the present invention is shown. An output circuit 10a of this embodiment is simplified compared to the output circuit 10 of the first embodiment shown in FIG. 1. The output circuit 10a includes the output switch 11, a gate control circuit 12a, the overcurrent detection circuit 16, the current generation circuit 17, and a shut-down signal generation circuit 22. The gate control circuit 12a has a function to forcibly turn off the output switch 11 upon receipt of a given shut-down signal and a function to control the level of a signal input to the output switch 11 in such a way that a current flows through the output switch 11 does not exceed a given value, in addition to the functions which the gate control circuit 12 of the first embodiment in FIG. 1 has.

The shut-down signal generation circuit 22 includes a pMOS 8 for charge, a capacitor CP2, a switch SW3, and an operational amplifier OP3. The charge pMOS 8 and the capacitor CP2 are inserted serially between both lines of the power source V1, and the switch SW3 is inserted between the charge pMOS 8 and the capacitor CP2. The gate of the charge pMOS 8 is connected to the gate of the pMOS 1 of the current generation circuit 17, and the charge pMOS 8 and the pMOS 1 constitute a current mirror. The inverting input terminal of the operational amplifier OP3 is connected to the lower-voltage power line of the power source V1 through a power source $V_{ref2}$, and the non-inverting input terminal is connected to the lower-voltage power line of the power source V1 through the capacitor CP2. The switch SW3 is switched according to a signal from the overcurrent detection circuit 16.

When the output switch 11 is on, if abnormality occurs in the load and the overcurrent detection circuit 16 detects that the voltage difference $V_{on}$ between the power terminal Vbb and the output terminal OUT exceeds a threshold value $V_{ref}$, the switch SW3 is closed in the shut-down signal generation circuit 22. At this time, the current generation circuit 17 generates a current $I_1$ that depends on the voltage difference between Vbb and OUT. The capacitor CP2 is charged with a charge current $I_5$, which is determined by the current $I_1$ through the charge PMOS 8. As the capacitor CP2 is charged, the voltage of the non-inverting input terminal of the operational amplifier OP3 gradually increases. When the voltage of the non-inverting input terminal of the OP3 exceeds the voltage of the inverting input terminal, the shut-down signal generation circuit 22 transmits a given shut-down signal for forcibly turning off the output switch 11 to the gate control circuit 12a.

The output circuit of this embodiment allows adjusting the shut-down time according to the degree of abnormality occurring in the load just like that of the first embodiment, with a simpler circuit configuration than the configuration of the first embodiment. Thus, if the degree of the abnormality occurring in the load is high and the voltage difference $V_{on}$ between the power terminal Vbb and the output terminal OUT is large, the output switch 11 can be immediately turned off. If the degree of the abnormality is low, on the other hand, the output switch 11 can be turned off after a certain period of time. This allows effective protection of the output switch 11 from breakdown.

Figure 7A:
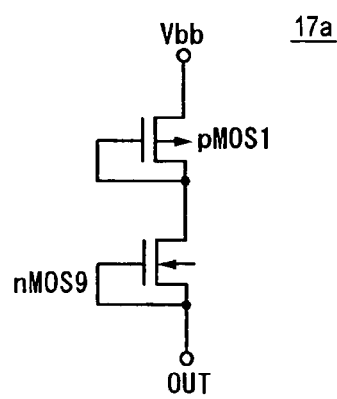
FIG. 7A is a circuit diagram showing another example of the configuration of a current generation circuit.
Figure 7B:
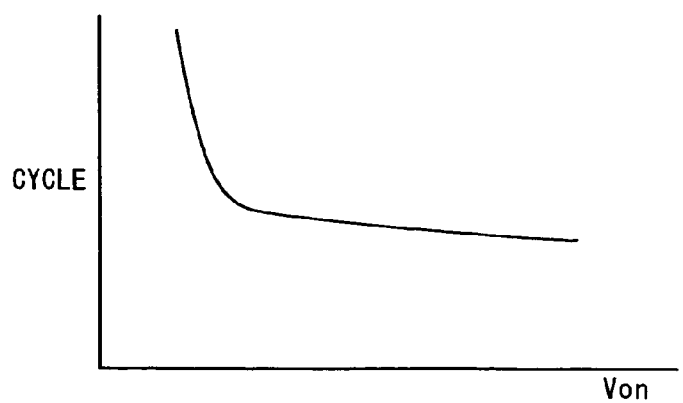
FIG. 7B is a graph showing a relationship of the voltage difference $V_{on}$ and the cycle of the clock signal "C".
Figure 8A:
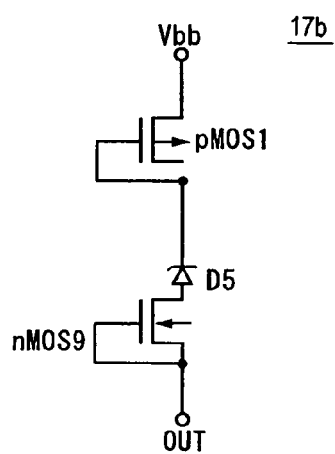
FIG. 8A is a circuit diagram showing another example of the configuration of the current generation circuit.
Figure 8B:
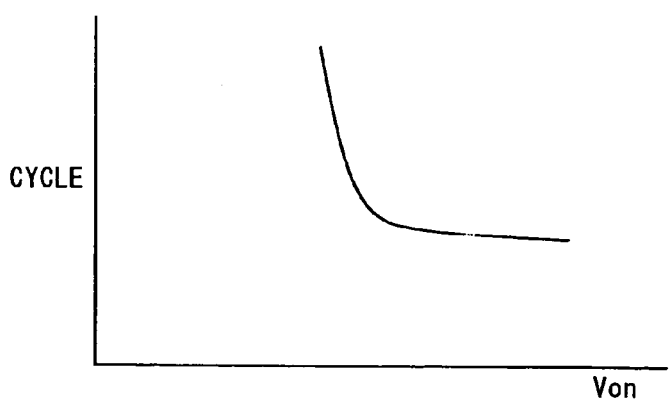
FIG. 8B is a graph showing a relationship of the voltage difference $V_{on}$ and the cycle of the clock signal "C".
Figure 9A:
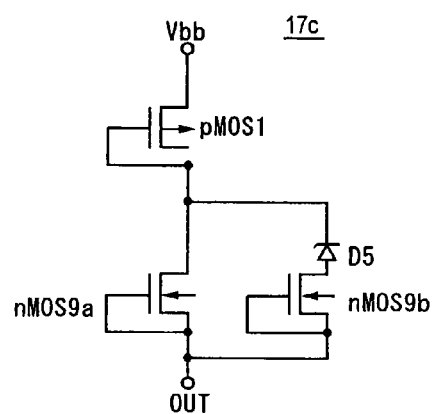
FIG. 9A is a circuit diagram showing another example of the configuration of the current generation circuit.
Figure 9B:
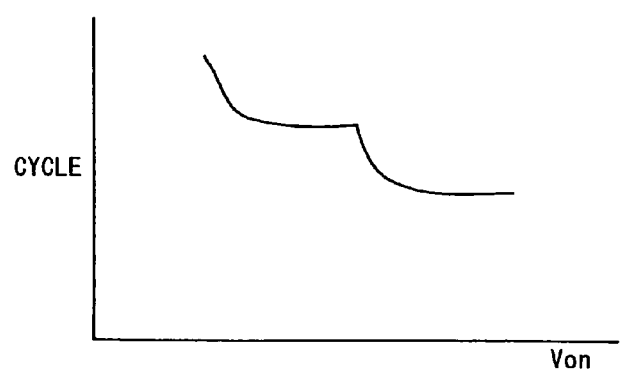
FIG. 9B is a graph showing a relationship of the voltage difference $V_{on}$ and the cycle of the clock signal "C".

The current generation circuit 17 does not necessarily have the configuration described above, and it may have another configuration. It is possible in the output circuit of the present invention to change the configuration of the current generation circuit 17 and appropriately set the characteristics of the voltage difference $V_{on}$ between the power terminal Vbb and the output terminal OUT and the current $I_1$ generated by the current generation circuit 17 according to the load connected to the output terminal OUT, thereby adjusting the relationship between the voltage difference $V_{on}$ between Vbb and OUT and the shut-down time. FIGS. 7A, 8A and 9A each show another example of the configuration of the current generation circuit 17. FIGS. 7B, 8B and 9B each show the relationship of the voltage difference $V_{on}$ between the power terminal Vbb and the output terminal OUT and the cycle of the clock signal "C" when the current generation circuit 17 of the output circuit 10 is configured as shown in FIGS. 7A, 8A and 9A, respectively.

For example, a current generation circuit 17a shown in FIG. 7A has a nMOS 9 of a depression type in which the source is connected to the gate, instead of the resistor R0 in the current generation circuit 17 in FIG. 1, as a load element of the pMOS 1. In the current generation circuit 17a, the cycle of the clock signal "C" changes as shown in FIG. 7B, depending on the voltage difference $V_{on}$ between the power terminal Vbb and the output terminal OUT. Compared to the relationship of the voltage difference $V_{on}$ between Vbb and OUT and the cycle of the clock signal "C" in the current generation circuit 17 shown in FIG. 4, a change in the cycle of the clock signal "C" in FIG. 7B is smaller in the region where the voltage difference $V_{on}$ between Vbb and OUT is larger than a certain value.

A current generation circuit 17b shown in FIG. 8A has a configuration in which a zener diode D5 is inserted as a load element of the pMOS 1 between the pMOS 1 and the nMOS 9 in the current generation circuit 17a shown in FIG. 7A. In the current generation circuit 17b, the cycle of the clock signal "C" changes as shown in FIG. 8B, depending on the voltage difference $V_{on}$ between Vbb and OUT. In FIG. 8B, the graph of FIG. 7B shifts to the higher voltage side in the voltage difference $V_{on}$ between Vbb and OUT.

The current generation circuit may have a configuration where a plurality of load elements having different current-voltage characteristics are connected in parallel. For example, in a current generation circuit 17c shown in FIG. 9A, a nMOS 9a, which is the load element of the pMOS 1 in the current generation circuit 17a of FIG. 7A, and a nMOS 9b and a zener diode D5 connected in series, which are the load elements of the pMOS 1 in the current generation circuit 17b of FIG. 8A, are connected in parallel. As shown in FIG. 9B, the relationship of the voltage difference $V_{on}$ between Vbb and OUT and the cycle of the clock signal "C" in the current generation circuit 17c is like a combination of those shown in FIGS. 7B and 8B, in which the cycle of the clock signal "C" significantly changes in two phases.

FIG. 5 shows the case where a off-time ($T_{OFF}$) from when the counter 15 outputs a low-level signal "D" to when it rises the signal "D" to a high level is constant regardless of the immediately preceding shut-down time. The off-time $T_{OFF}$, however, may be changed according to the immediately preceding shut-down time. For example, the output circuit 10 may further have a time circuit for generating the off-time referring to the immediately preceding shut-down time to allow the output signal "D" of the counter 15 to rise to a high level. In this case, the time circuit may set the off-time $T_{OFF}$ longer if the immediately preceding shut-down time is short and set it shorter if the immediately preceding shut-down time is long.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An output circuit comprising:
   an output transistor connected in series with a load, wherein the output transistor supplies a load current; and
   a protection circuit for protecting the output transistor,
   wherein the protection circuit comprises a current detection circuit which detects if the load current exceeds a threshold value, and an off-signal generation circuit for generating an off-signal to turn off the output transistor,
   wherein the off-signal generation circuit generates the off-signal after an elapsed time from the detection of the load current exceeding the threshold value and the elapsed time depends on a voltage drop of the output transistor,
   wherein the off-signal generation circuit comprises a clock signal generation circuit which generates a clock signal and a counter for counting the clock signal and generating the off-signal after counting a given number of clocks, and
   wherein the clock signal generation circuit comprises a current generator which generates a current depending on the voltage drop of the output transistor and a capacitor to be charged with the current generated by the current generator, and the clock signal has a cycle depending on a charge time of the capacitor.

2. An output circuit according to claim 1, wherein the off-signal generation circuit removes the off-signal after a certain elapsed time from generation of the off-signal.

3. An output circuit according to claim 1, wherein the off-signal generation circuit removes the off-signal after another elapsed time depending on a voltage drop of the output translator from generation of the off signal.

4. An output circuit according to claim 1, wherein the current detection circuit detects if the load current exceeds the threshold value based on whether a voltage drop of the output transistor exceeds a threshold value.

5. An output circuit according to claim 1, wherein the off-signal generation circuit comprises a current generator for generating a current depending on a voltage drop of the output transistor and a capacitor to be charged with the current generated by the current generator, and the off-signal generation circuit generates the off-signal if a terminal voltage of the capacitor exceeds a given value.

6. An output circuit according to claim 5, wherein the current generator comprises a current minor comprising a reference transistor through which a current depending on a voltage drop of the output transistor flows and an output transistor connected in series with the capacitor.

7. An output circuit according to claim 1, wherein the current generator comprises a current mirror comprising a reference transistor through which a current depending on a voltage drop of the output transistor flows and an output transistor connected in series with the capacitor.

8. An output circuit according to claim 7, wherein load elements comprising a MOS transistor of which a gate and a source are connected to each other and at least one zener diode connected in series with the MOS transistor are connected in series with the reference transistor of the current mirror.

9. An output circuit according to claim 8, wherein a plurality of the load elements are connected in parallel and are connected to the reference transistor of the current mirror.

10. An output circuit according to claim 8, wherein another MOS transistor of which a gate and a source are connected to each other is connected in parallel with the load elements.

11. A protection circuit for protecting an output transistor connected in series with a load for supplying a load current, the protection circuit comprising:
    a current detection circuit which detects if the load current exceeds a threshold value; and
    an off-signal generation circuit which generates an off-signal to turn off the output transistor depending on a voltage drop of the output transistor,
    wherein the off-signal generation circuit generates the off-signal after an elapsed time from the detection of the load current exceeding the threshold value and the elapsed time depends on the voltage drop of the output transistor,
    wherein the off-signal generation circuit comprises a clock signal generation circuit which generates a clock signal and a counter which counts the clock signal and generating the off-signal after counting a given number of clocks, and
    wherein the clock signal generation circuit comprises a current generator which generates a current depending on the voltage drop of the output transistor and a capacitor to be charged with the current generated by the current generator, and the clock signal has a cycle depending on a charge time of the capacitor.

12. An output circuit comprising:
    an output transistor connected in series with a load, wherein the output transistor supplies a load current; and
    a protection circuit for the output transistor,
    wherein the protection circuit comprises a current detection circuit which detects if the load current exceeds a threshold value, and an off-signal generation circuit for generating an off-signal to turn off the output transistor,
    wherein the of generation circuit generates the off-signal after an elapsed time from the detection of the load current exceeding the threshold value and the elapsed time depends on a voltage drop of the output transistor,
    wherein the off-signal generation circuit comprises a current generator for generating a current depending on a voltage drop of the output transistor and a capacitor to be charged with the current generated by the current generator, and the off-signal generation circuit generates the off-signal if a terminal voltage of the capacitor exceeds a given value,
    wherein, the current generator comprises a current mirror comprising a reference transistor through which a current dependina on a voltage drop of the output transistor flows and an output transistor connected in series with the capacitor, and wherein load elements comprising a MOS transistor of which a gate and a source are connected to each other and at least one zener diode connected in series with the MOS transistor are connected in series with the reference transistor of the current mirror.

13. An output circuit according to claim 12, wherein a plurality of the load elements are connected in parallel and are connected to the reference transistor.

14. An output circuit according to claim 12, wherein another MOS transistor of which a gate and a source are connected to each other is connected in parallel wit the load elements.

15. An output circuit having an overcurrent protecting function comprising:
   an output transistor connected in series with a load for supplying a load current; and
   a protection circuit for protecting the output transistor;
   the protection circuit comprising:
      an overcurrent detection circuit for detecting if the load current exceeds a threshold value; and
      an off-signal generation circuit for generating an off-signal to turn off the output transistor after a time period depending on a voltage drop of the output transistor has elapsed since the current detection circuit detects that the load current exceeds the threshold value,
   wherein the off-signal generation circuit comprises:
      a first current generator for generating a current depending on the voltage drop of the output transistor;
      a second current generator for generating a current depending on the current generated by the first current generator;
      a clock generator, which generates clock signal, comprising a capacitor determining the cycle of a clock, a switch for charging and discharging the capacitor; and
      a counter for counting the clock signals,
   wherein the second current generator determines the charge and discharge currents of the capacitor, the overcurrent detection circuit controls the switch and wherein the off-signal generation circuit generates the off-signal after counting a given number of clocks signals.

16. An output circuit having an overcurrent protecting function comprising:
   a protection circuit for protecting an output transistor, said output transistor being connected in series with a load for supplying a load current;
   the protection circuit comprising:
      an overcurrent detection circuit including a first operational amplifier which detects if the load current exceeds a threshold value; and
      an off-signal generation circuit which generates an off-signal to turn off the output transistor after a time period depending on whether a voltage drop of the output transistor has elapsed since the current detection circuit detects that the load current exceeds the threshold value,
   wherein the off-signal generation circuit comprises:
      a current generator which generates a current depending on the voltage drop of the output transistor,
      a MOS transistor coupled to said current generator to constitute a current mirror circuit;
      a capacitor coupled to said MOS transistor to charge from a current from said MOS transistor;
      a switch coupled between said capacitor and said MOS transistor controlling the charging of said capacitor wherein said overcurrent detection circuit controls the switch; and
      a second operational amplifier which generates said off-signal if the terminal voltage of said capacitor exceeds a given value.

* * * * *